United States Patent [19]

Polak

[11] 4,382,101

[45] May 3, 1983

[54] METHOD FOR INCREASING THE PEEL STRENGTH OF METAL-CLAD POLYMERS

[75] Inventor: Anthony J. Polak, Lake Zurich, Ill.

[73] Assignee: UOP Inc., Des Plaines, Ill.

[21] Appl. No.: 350,972

[22] Filed: Feb. 22, 1982

Related U.S. Application Data

[63] Continuation-in-part of Ser. No. 228,019, Jan. 23, 1981, Pat. No. 4,337,279.

[51] Int. Cl.³ ............................................... B05D 3/06
[52] U.S. Cl. .................... 427/40; 204/159.15; 204/159.22; 427/304; 427/305; 427/306; 427/322; 428/473.5
[58] Field of Search ............. 427/40, 304, 322, 305, 427/306; 204/159.15, 159.22; 428/461, 462, 473.5

[56] References Cited

U.S. PATENT DOCUMENTS

| | | | |
|---|---|---|---|
| 3,801,368 | 4/1974 | Fusayama et al. | 427/304 X |
| 3,914,521 | 10/1975 | Beatty et al. | 427/40 X |
| 3,929,604 | 12/1975 | Shirahata et al. | 427/39 X |
| 4,165,394 | 8/1979 | Ehrbar et al. | 427/40 |
| 4,250,225 | 2/1981 | Shirahata et al. | 427/40 X |

*Primary Examiner*—Michael R. Lusignan
*Attorney, Agent, or Firm*—James R. Hoatson, Jr.; Raymond H. Nelson; William H. Page, II

[57] ABSTRACT

The peel strength of metal-clad polymers such as a polyimide polymer may be increased by treating said polymer with a gas plasma prior to the deposition of the metal thereon. The gas plasma is provided for by the introduction of a gas such as helium, argon, compositions of gases such as carbon tetrafluoride and oxygen over the surface of the polymer while said polymer is in an electrical field in which the power may range from about $3.8 \times 10^{-3}$ watts/cm² to about 100 watts/cm².

6 Claims, No Drawings

METHOD FOR INCREASING THE PEEL STRENGTH OF METAL-CLAD POLYMERS

CROSS-REFERENCE TO RELATED APPLICATIONS

This application is a continuation-in-part of my co-pending application, Ser. No. 228,019 filed Jan. 23, 1981, all teachings of which are incorporated herein, now U.S. Pat. No. 4,337,279, patented June 29, 1982.

BACKGROUND OF THE INVENTION

Polymers which contain a coating of a metal, and particularly a conductive metal, find a wide variety of uses in the electronics field. For example, circuit boards are widely used in communication equipment, such as telephonic or video equipment. In many instances where the particular piece of equipment is subjected to friction or wear, it is desirable that the metal which is bonded to the plastic polymeric substrate be able to withstand any deleterious effects which are caused by the aforesaid friction or wear. In this respect, it is necessary that the metal be firmly bonded to the substrate material in order to withstand any displacement which may occur and thus impair the efficiency of the particular piece of equipment or render the same useless.

As will hereinafter be shown in greater detail, a method for increasing the adhesive properties of metals to the substrate material has been discovered whereby the peel strength may be greatly increased and thus enhance the efficiency of the composite.

SUMMARY OF THE INVENTION

This invention relates to a method for increasing the peel strength of metal-clad polymers. More specifically, the invention is concerned with a process for enhancing the adhesive properties of a polymeric material whereby an increased bond of metal to said polymeric substrate can be strengthened.

As hereinbefore set forth, the ability of metal to retain an intimate bond to polymeric substrates is a desirable feature in many electronic or electrical pieces of equipment. By utilizing the method of the present invention, it has been found that an increase in the bonding properties may be obtained with a concomitant increase in the peel strength of a metal-clad polymer or laminate. This increase, as will hereinafter be shown, is obtained by sujecting the polymeric substrate to a pretreatment process prior to deposition of the metal on the surface of said polymer. The term "polymer" as used in the present specification and appended claims will refer to substrate materials which comprise either a single layer of a polymeric material or a multiplicity of layers of the polymeric material, either bonded together or containing a dissimilar material such as glass fibers interspersed between the layers or contained therein.

It is therefore an object of this invention to provide a method for increasing the peel strength of metal-clad polymers.

In one aspect, an embodimemnt of this invention resides in a process for increasing the peel strength of a metal-clad polyimide polymer which comprises subjecting said polyimide polymer to a gas plasma comprising the presence of a treatment gas and an electrical field generated from an electrical power of from about $3.8 \times 10^{-3}$ watts/cm$^2$ to about 100 watts/cm$^2$ at a temperature of from about ambient to about the glass transition temperature of said polyimide polymer and a pressure in the range of from about 5 atmospheres to about $10^{-6}$ torr for a period of time ranging from about 0.1 minute to about 4 hours, thereafter depositing a metal on the resultant treated polyimide polymer, and recovering the resultant metal-clad polyimide polymer possessing increased peel strength.

A specific embodiment of this invention is found in a process for increasing the peel strength of a metal-clad polymer which comprises subjecting a polyimide polymer to a gas plasma in which the gas which is present comprises helium and an electrical field generated from an electrical power of from about $3.8 \times 10^{-3}$ watts/cm$^2$ to about 100 watts/cm$^2$ at a temperature in the range of from about ambient to about the glass transition temperature of said polyimide polymer and a pressure in the range of from about 5 atmospheres to about $10^{-6}$ torr for a period of time ranging from about 0.1 minute to about 4 hours, thereafter depositing copper on the resultant treated polyimide polymer and recovering the resultant copper-clad polyimide polymer.

Other objects and embodiments will be found in the following further detailed description of the present invention.

DETAILED DESCRIPTION OF THE INVENTION

As hereinbefore set forth, the present invention is concerned with a process for obtaining improved peel strength of metal-clad polymers. The improvement in the peel strength is effected by treating a polymeric substance in a gas plasma prior to deposition of the metal on the surface of the polymer. A gas plasma is formed by the interaction of a gas with an electric field. For example, an electrical field may be provided for by a Radio Frequency Generator which will provide the necessary field for interaction with a gas of the type hereinafter set forth in greater detail to produce radical species primarily by electron-induced dissociation. These species will then interact with the outermost atomic layers of the polymeric material, whereby a stronger bond with a subsequently deposited metal can be achieved.

Examples of gases which may be utilized to form the gas plasma will include inert gases such as helium, argon, krypton, xenon, neon, radon, nitrogen, etc. as well as other gases such as oxygen, air, carbon monoxide, carbon dioxide, carbon tetrachloride, chloroform, hydrogen, etc., fluoridated gases which are commonly known as Freons including carbon tetrafluoride, carbon hexafluoride, dichlorodifluoromethane, trifluorochloromethane, trichlorofluoromethane as well as mixtures of the aforesaid gases. Of the aforementioned gases, the preferred gases which are employed will include helium, argon and nitrogen. It is to be understood that the aforementioned list of gases is only representative of the type of gases which may be employed and that the present invention is not necessarily limited thereto.

The reaction in which the peel strength of a polyimide polymer is increased by treating said polymer with a gas plasma of the type hereinbefore set forth will include a temperature which may range from about ambient (20°–25° C.) up to the glass transition or melting temperature of the polyimide polymer, that is, up to about 250° C. Other operating parameters which are employed in the process of this invention will include pressures which may range from superatmospheric, that is, up to about 5 atmospheres, down to subatmospheric pressures of about $10^{-6}$ torr and an electric power which may be from various sources such as direct current (D.C.), alternating current (A.C.), audio frequency (A.F.), intermediate frequency (I.F.), radio frequency (R.F.), microwave frequency, etc. The power density which is employed will be the electrical power per unit area and will range from about $3.8 \times 10^{-3}$ watts/cm$^2$ to about 100 watts/cm$^2$. The power which is employed may be obtained from any source of electrical energy, a specific example being a generator. The treatment of the polyimide polymer with a gas plasma is effected for a period of time which may range from about 0.1 minute up to about 4 hours or more in duration, the time of treatment depending upon the other operating conditions including temperature, pressure and power, and will be for a period of time sufficient to treat the surface of the laminate of the polymer until said surface is more susceptible to the subsequent bonding procedure. It is contemplated within the scope of this invention that the deposition of metal on the surface of the laminate or polymer may be effected within a relatively short period of time subsequent to the gas plasma treatment or, if so desired, the plasma-treated polymer may be aged by exposure to the atmosphere for a period of time which may range up to about 8 weeks or more in duration in order to increase the adhesive properties of the polymer surface.

The deposition of the metal on the surface of the polymer may be accomplished by any means known in the art, utilizing such deposition or cladding procedures such as sputter deposition, electrolysis deposition, electrolytic deposition, evaporation, pressing, etc. Examples of metals which may be deposited on the surface of the polymer will include, in particular, conductive metals such as, but not limited to, copper, zinc, nickel, aluminum, silver, gold, iron, steel and alloys such as brass, Monel metal, molybdenum-tungsten alloys, aluminum-copper-gold alloys, etc. If so desired, the metal may be deposited on the surface of the polymer in varying thicknesses, said thicknesses ranging from about 0.01 to about 1,000 microns or more, the thickness of the metal being dependent upon the particular use to which the metal-clad polymer is to be applied.

The process of this invention may be effected in either a closed or open system. For example, when a closed system is employed, the polyimide polymer which is to be treated is placed in a closed chamber and the particular gas which is employed is passed into the chamber. The chamber will be maintained at pretreatment operating conditions of temperature and pressure, the operating parameters of which having been hereinbefore set forth. Therefore, the chamber is subjected to a high electric field between two electrodes. A discharge is obtained, which is the gas plasma, and which consists of ions, free radicals, and metastables gas species, the latter being forms which cannot exist outside of the electric field, except for a very short period of time. The plasma products are allowed to treat the surface of the polyimide polymer for a predetermined period of time whereby the surface of said polyimide polymer is modified and the adhesive property thereof is enhanced. Following the expiration of the reaction time, electric power is discontinued and the treated polyimide polymers are recovered. Following this, the plasma-treated polyimide polymers are then clad with a metal by any one of the means hereinbefore set forth and recovered. The resulting metal-clad polymer will possess a peel strength greater than a metal-clad polymer in which the polymer has not been subjected to a gas plasma treatment prior to the deposition of the metal thereon.

It is also contemplated within the scope of this invention that the gas plasma treatment of the polyimide polymer may be effected in an open system in which the polyimide polymer to be treated is placed in an electric field between two electrodes and subjected to the electric field while a gas of the type hereinbefore set forth is flowed over the surface of the polyimide polymer, said polymer being maintained at a pretreated operating temperature. Following the treatment of the polyimide polymer in an open system for a predetermined period of time, the modified polyimide polymer is then subjected to a metal deposition in a manner similar to that hereinbefore set forth, and recovered.

The following examples are given for the purpose of illustrating the process of the present invention and the improved peel strength of gas plasma treated polymers which had been metal-clad. However, it is to be understood that these examples are merely illustrative of the process and that the present invention is not necessarily limited thereto.

EXAMPLE I

In this example, a polymer comprising B-stage polyimides in the shape of a board which was $9'' \times 3'' \times 0.062''$ in dimension was treated with a gas plasma by placing the polymer in a closed chamber. The gas was passed into the chamber while being subjected to an electric field at a radio frequency (R.F.) power of $1 \times 10^{-1}$ watts/cm$^2$, while maintaining the pressure in the chamber in a range of from 0.5 to about 1 torr. The board was treated for a period of time ranging from 0.5 to 20 minutes at this pressure following which the R.F. power was discontinued and the board was recovered. The boards were treated by cladding with copper, said cladding being effected by pressing 1 oz. T.C. copper foil (37 microns thickness) on the treated boards for a period of 15 minutes at a temperature of 220° C. under a pressure of 125 psi. Following the cladding of the polyimide board with the copper, the copper-clad boards were recovered and a strip of tape ⅛" wide was applied to the copper surface. The boards were then placed in a ferric chloride solution which etched off all of the copper except for the copper which was under the tape. Thereafter, the tape was removed, leaving a ⅛" strip of copper bonded to the polyimide.

The peel strength of the copper-clad polyimide was determined by subjecting said clad polymer to a peel strength test using as the instrument for said measurement a device known as an Instron. The sample to be tested was placed between two grips, one grip (a vacuum grip) holding the clad polymer while the other grip held the copper foil. The peel strength was determined by moving the grip clasping the copper foil in a direction normal to the surface of the polymer at a constant cross-head speed of 2" per minute. The force required to peel the copper from the surface of the polyimide was automatically recorded by the device and the peel strength, which is measured in lbs./in. was determined.

In Table I below, the peel strength of helium plasma treated polyimide pre-preg as a function of exposure time utilizing various electrical power and pressure is set forth.

TABLE I

| Electric Power Watts/cm$^2$ | Pressure (Torr) | Peel Strength (lbs/in) Time (min) | | |
|---|---|---|---|---|
| | | 0.5 | 5 | 20 |
| | 1 | 7 | 7.7 | 8 |
| | 0.5 | 6.5 | 6.5 | 6.8 |
| | 0.5 | 6 | 4.3 | 6.5 |
| | 1 | 7.8 | 7.9 | 8 |

EXAMPLE II

In this example, a polyimide board was treated in a manner similar to that hereinbefore set forth, that is, the polyimide boards when exposed to a gas plasma comprising a mixture of carbon tetrafluoride and oxygen in a ratio of 75/25, said exposure being effected for periods of time ranging from 0.5 to 20 minutes. The pressure which was utilized in treating these boards ranged from 0.5 to 2 torr and a R.F. power of $5 \times 10^{-2}$ watts/cm$^2$. The initial peel strength prior to exposure to the plasma of the boards was 7.2. At 0.5 minutes, the board which had been treated at a pressure of 0.5 torr was found to have a peel strength of 8.75, the boards being treated at 1 torr and 2 torr each had a peel strength of 7.5. The boards which were treated for a period of 5 minutes had a peel strength of 8.25 for that board which was treated at a pressure of 0.5, while the boards which were treated at 1 torr and 2 torr each had a peel strength of 7.6. The boards which were treated for a period of 20 minutes were found to all have a peel strength of 7.4.

It is apparent that polyimide boards which were treated at a relatively low pressure, that is, about 0.5 torr for a relatively short period of time, that is, about 0.5 minutes will possess an increased peel strength over untreated boards.

I claim as my invention:

1. A process for increasing the peel strength of a metal-clad polyimide polymer which comprises subjecting said polyimide polymer to a carbon tetrafluoride/oxygen gas plasma in an electrical field generated from an electrical power of from about $3.8 \times 10^{-3}$ watts/cm$^2$ to about 100 watts/cm$^2$ at a temperature of from about ambient to about the glass transition temperature of said polyimide polymer and a pressure in the range of from about 5 atmospheres to about $10^{-6}$ torr for a period of time ranging from about 0.1 minutes to about 4 hours, thereafter depositing a conductive metal on the resultant treated polyimide polymer and recovering the resultant metal-clad polyimide polymer processing increased peel strength.

2. The process as set forth in claim 1 in which said conductive metal is copper.

3. The process as set forth in claim 1 in which said conductive metal is nickel.

4. The process as set forth in claim 1 in which said conductive metal is aluminum.

5. The process as set forth in claim 1 in which said conductive metal is zinc.

6. The process as set froth in claim 1 in which said conductive metal is brass.

* * * * *